United States Patent [19]

Kohsiek

[11] Patent Number: 4,903,116
[45] Date of Patent: Feb. 20, 1990

[54] INTEGRATED SEMICONDUCTOR CIRCUIT HAVING A MULTILAYER WIRING

[75] Inventor: Cord H. Kohsiek, Ellerau, Fed. Rep. of Germany

[73] Assignee: U.S. Philips Corp., New York, N.Y.

[21] Appl. No.: 384,850

[22] Filed: Jul. 20, 1989

Related U.S. Application Data

[63] Continuation of Ser. No. 126,383, Nov. 30, 1987, abandoned.

[30] Foreign Application Priority Data

Dec. 3, 1986 [DE] Fed. Rep. of Germany ....... 3641299

[51] Int. Cl.$^4$ ...................... H01L 23/54; H01L 23/48
[52] U.S. Cl. .......................................... 357/71; 357/68
[58] Field of Search ............................ 357/67, 68, 71

[56] References Cited

U.S. PATENT DOCUMENTS

| | | | |
|---|---|---|---|
| 3,879,840 | 4/1975 | Ames et al. | 357/67 |
| 3,946,420 | 3/1976 | Hartsell | 357/68 |
| 3,946,421 | 3/1976 | Hartsell et al. | 357/68 |
| 4,012,767 | 3/1977 | Brown et al. | 357/68 |
| 4,484,212 | 11/1984 | Konatsu et al. | 357/68 |
| 4,491,860 | 1/1985 | Lim | 357/67 R |
| 4,587,549 | 5/1986 | Ushiku | 357/68 |
| 4,694,320 | 9/1987 | Asaro | 357/68 |
| 4,746,965 | 5/1988 | Nishi | 357/68 |

Primary Examiner—Rolf Hille
Assistant Examiner—S. V. Clark
Attorney, Agent, or Firm—Steven R. Biren

[57] ABSTRACT

In integrated semiconductor circuits having multilayer wiring, in which the circuit elements formed in the semiconductor body are interconnected by connection conductors which extend at at least two levels located one above the other and are mutually separated by insulating layers, undesired couplings may occur between the circuit elements and the conductor tracks extending above them. These disturbing couplings can be avoided by having at least one connection conductor of a lower wiring level so positioned and shaped and connected to such a potential that it constitutes a screening element between at least one underlying circuit element and at least one connection conductor at an upper wiring level.

2 Claims, 1 Drawing Sheet

INTEGRATED SEMICONDUCTOR CIRCUIT HAVING A MULTILAYER WIRING

This is a continuation of application Ser. No. 126,383, filed Nov. 30, 1987.

BACKGROUND OF THE INVENTION

The invention relates to an integrated semiconductor circuit having multilayer wiring and comprising circuit elements formed in a semiconductor body, said circuit elements being interconnected by connection conductors extending at at least two levels, the connection conductors at a given level being separated from the connection conductors at the next level by an insulating layer.

In integrated circuits of this kind, the problem may arise that undesired (capacitive) couplings occur between the circuit elements formed in the semiconductor body and the connection conductors extending above them.

SUMMARY OF THE INVENTION

In order to avoid such undesired couplings, an integrated circuit of the general kind mentioned above according to the invention is characterized in that at least one connection conductor is situated at a lower, first level between said circuit elements and a higher, second level of connection conductors, said one connection conductor having such a position and shape, and being connected to such a potential that it constitutes at least in part a screening between at least one underlying circuit element and at least one connection conductor of said second level.

It is already known from the published Japanese Patent Application JP A2 60-187038 to arrange in an integrated semiconductor circuit having a multilayer wiring between two wiring levels—separated therefrom by insulating layers—a metal layer which is connected to ground potential and covers the whole surface in order to avoid a cross-talk between the conductor tracks of the two aforementioned wiring levels. In this prior art however the metal layer forms a separate metal plane and is not associated with the connection conductors.

BRIEF DESCRIPTION OF THE DRAWINGS;

In order that the invention may be readily carried out, it will now be described more fully, by way of example, with reference to the accompanying drawing, in which.

Figure 1:
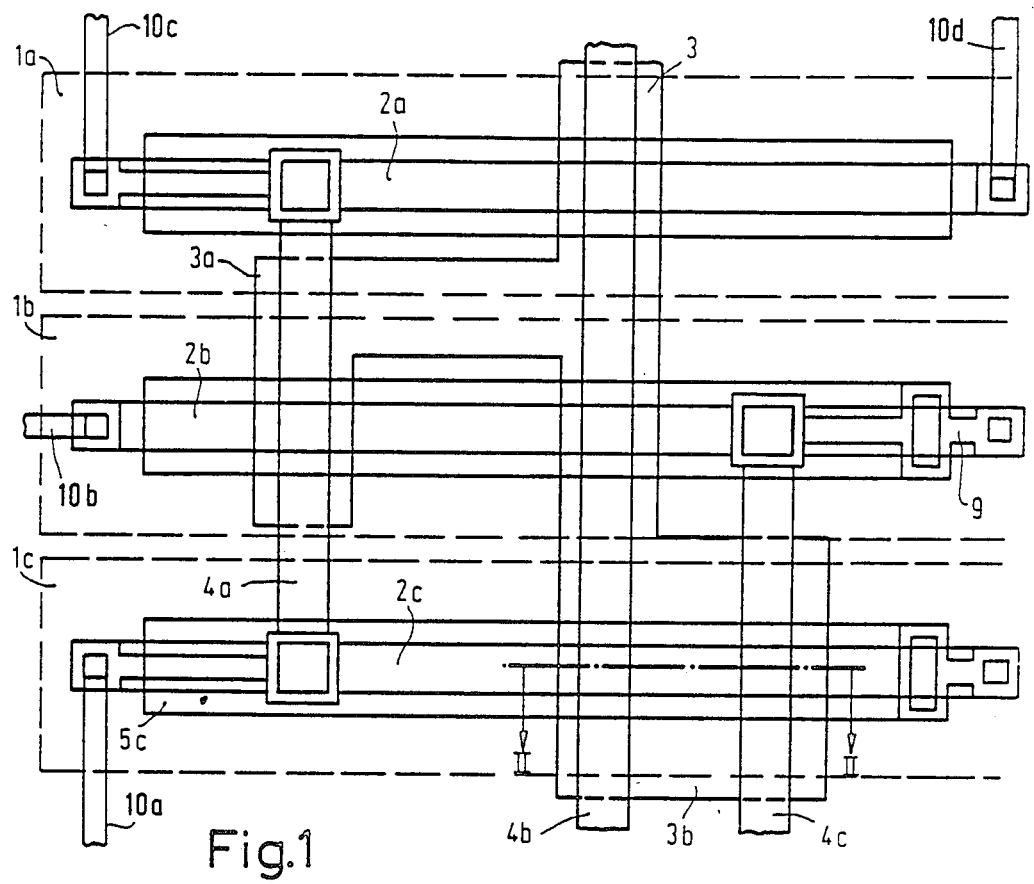
FIG. 1 is a plan view of an integrated semiconductor circuit having two wiring levels.

DESCRIPTION OF THE PREFERRED EMBODIMENTS;

FIG. 1 shows a plan view of a cut-out part of an integrated semiconductor circuit, in which three resistors $2a$, $2b$ and $2c$ are formed in three islands $1a$ to $1c$. The resistors are constituted by p-type zones buried in an n-type semiconductor body. Above these resistors conductor tracks $4a$, $4b$ and $4c$ extend at the upper wiring level, which conductor tracks, as far as they are not directly connected to the resistors $2a$ to $2c$, such as the conductor track $4a$ to the resistors $2a$ and $2c$, should be decoupled to the greatest possible extent from these resistors.

Figure 2:
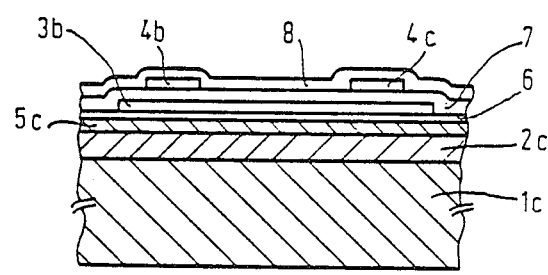
FIG. 2 is a sectional view taken on the line II–II in FIG. 1.

For this purpose, a conductor track 3 extends at the lower wiring level beside the remaining conductor tracks required there, such as, for example, the conductor tracks $10a$–$10d$, which conductor track 3 extends more particularly with its parts $3i$ a and $3b$ between the conductor tracks $4a$ to $4c$ of the upper wiring level and the resistors $2a$ to $2c$. An undesired capacitive coupling may occur, for example, between the upper conductor track $4c$ and the upper layer $5c$ of the semiconductor body, which is connected at 9 to the resistor $2b$. Conductor track 3 is connected at a suitable point to ground and thus serves as a suitable screening element. thus avoiding the undesired capacitive coupling that might otherwise occur between an upper conductive track and the upper layer of the semiconductor body;

FIG. 2 shows this in cross-section for the crossing of the conductor tracks $4b$ and $4c$ of the upper wiring level with the resistor $2c$. This resistor $2c$ is formed as a buried p-type zone $2c$ in an n-type semiconductor body $1c$ and $5c$, on which the part $3b$ of the screening conductor track 3 extends - in the zone considered here- over an insulating layer 6.

Above this track then extend, over a nitride layer 7, the two conductors $4b$ and $4c$ of the upper conductor track level, which are again covered on the upper side by a nitride layer 8. At the area considered here, the conductor track of the lower wiring level acting as a screening is widened to a surface $3b$, which extends below adjacent parts of several conductor tracks, here $4b$ and $4c$, of the upper wiring level.

By the use of such a conductor track 3, which extends at a lower wiring level and is of arbitrary shape and serves as a screening element, a satisfactory, capacitive decoupling between the conductor tracks of the upper wiring level and the circuit elements is obtained without it being required to insert a particular metallization surface serving as a screening.

What is claimed is:

1. An integrated semiconductor circuit having a multilayer wiring system and comprising circuit elements formed in a semiconductor body, said circuit elements being interconnected by connection conductors extending at at least two levels, the connection conductors at a lower, first level being separated from the connection conductors at a second, higher level by an insulating layer, characterized in that, in addition to the connection conductors being present at said first level for interconnecting said circuit elements, at least one further connection conductor is situated at said first level between said circuit elements and said second level of connection conductors, said one further connection conductor having a position, shape and fixed applied potential during operation such that it constitutes at least in part a screening element to prevent capacitive coupling between at least one underlying circuit element and at least one connection conductor of said second level.

2. An integrated semiconductor circuit as claimed in claim 1, characterized in that a part of the further connection conductor constituting said screening element occupies a position extending under parts of at least two connection conductors of said second level.

* * * * *